US010699965B1

(12) United States Patent
Greene et al.

(10) Patent No.: US 10,699,965 B1
(45) Date of Patent: Jun. 30, 2020

(54) REMOVAL OF EPITAXY DEFECTS IN TRANSISTORS

(71) Applicant: International Business Machines Corporation, Armonk, NY (US)

(72) Inventors: Andrew Greene, Slingerlands, NY (US); Ruilong Xie, Niskayuna, NY (US); Christopher Prindle, Poughkeepsie, NY (US); Pietro Montanini, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/285,779

(22) Filed: Feb. 26, 2019

(51) Int. Cl.
*H01L 21/8238* (2006.01)
*H01L 29/66* (2006.01)
*H01L 21/3105* (2006.01)
*H01L 21/311* (2006.01)
*H01L 27/092* (2006.01)
*H01L 29/165* (2006.01)
*H01L 29/08* (2006.01)

(52) U.S. Cl.
CPC ........... *H01L 21/823821* (2013.01); *H01L 21/31058* (2013.01); *H01L 21/31116* (2013.01); *H01L 21/823814* (2013.01); *H01L 21/823828* (2013.01); *H01L 27/0924* (2013.01); *H01L 29/6656* (2013.01); *H01L 29/66545* (2013.01); *H01L 29/0847* (2013.01); *H01L 29/165* (2013.01); *H01L 29/66636* (2013.01)

(58) Field of Classification Search
CPC ..... H01L 21/823821; H01L 21/823814; H01L 21/823828; H01L 29/66545; H01L 29/6656
See application file for complete search history.

(56) References Cited

U.S. PATENT DOCUMENTS

| 5,792,685 A | 8/1998 | Hammerl et al. |
| 5,893,735 A | 4/1999 | Stengl et al. |
| 6,358,851 B1 | 3/2002 | Wang et al. |
| 7,250,358 B2 | 7/2007 | Hall |

(Continued)

FOREIGN PATENT DOCUMENTS

| CN | 103872190 A | 6/2014 |
| CN | 103872190 B | 6/2014 |

OTHER PUBLICATIONS

Pit Fee Jao et al., "High density epitaxial unwanted growth and its effect on planarization in FINFET process," 29th Annual SEMI Advanced Semiconductor Manufacturing Conference (ASMC), 2018, pp. 159-162.

(Continued)

*Primary Examiner* — Douglas M Menz
(74) *Attorney, Agent, or Firm* — Cantor Colburn LLP; Joseph Petrokaitis

(57) ABSTRACT

Embodiments of the present invention are directed to techniques for removing epitaxy defect regions (or nodules) from a semiconductor structure. In a non-limiting embodiment of the invention, a sacrificial gate is formed over a channel region of a fin. The sacrificial gate can include a gate hard mask and a spacer. A source or drain region is formed adjacent to the channel region, resulting in a defect region being formed on a surface of the gate hard mask or the spacer. An organic planarization layer (OPL) is formed on a surface of the source or drain region and the defect region is removed.

20 Claims, 16 Drawing Sheets

(56) References Cited

U.S. PATENT DOCUMENTS

| | | |
|---|---|---|
| 8,906,759 B2 | 12/2014 | Basker et al. |
| 9,318,575 B2 | 4/2016 | Jeong et al. |
| 9,461,146 B1 | 10/2016 | Cheng et al. |
| 9,576,979 B2 | 2/2017 | Cheng et al. |
| 9,768,272 B2 | 9/2017 | Hashemi et al. |
| 2018/0047726 A1 | 2/2018 | Cheng et al. |

OTHER PUBLICATIONS

Talapady Srivatsa Bhat et al., "Parameters influencing unwanted growth during epitaxial growth of SiGe," 27th Annual SEMI Advanced Semiconductor Manufacturing Conference (ASMC), 2016, pp. 212-217.

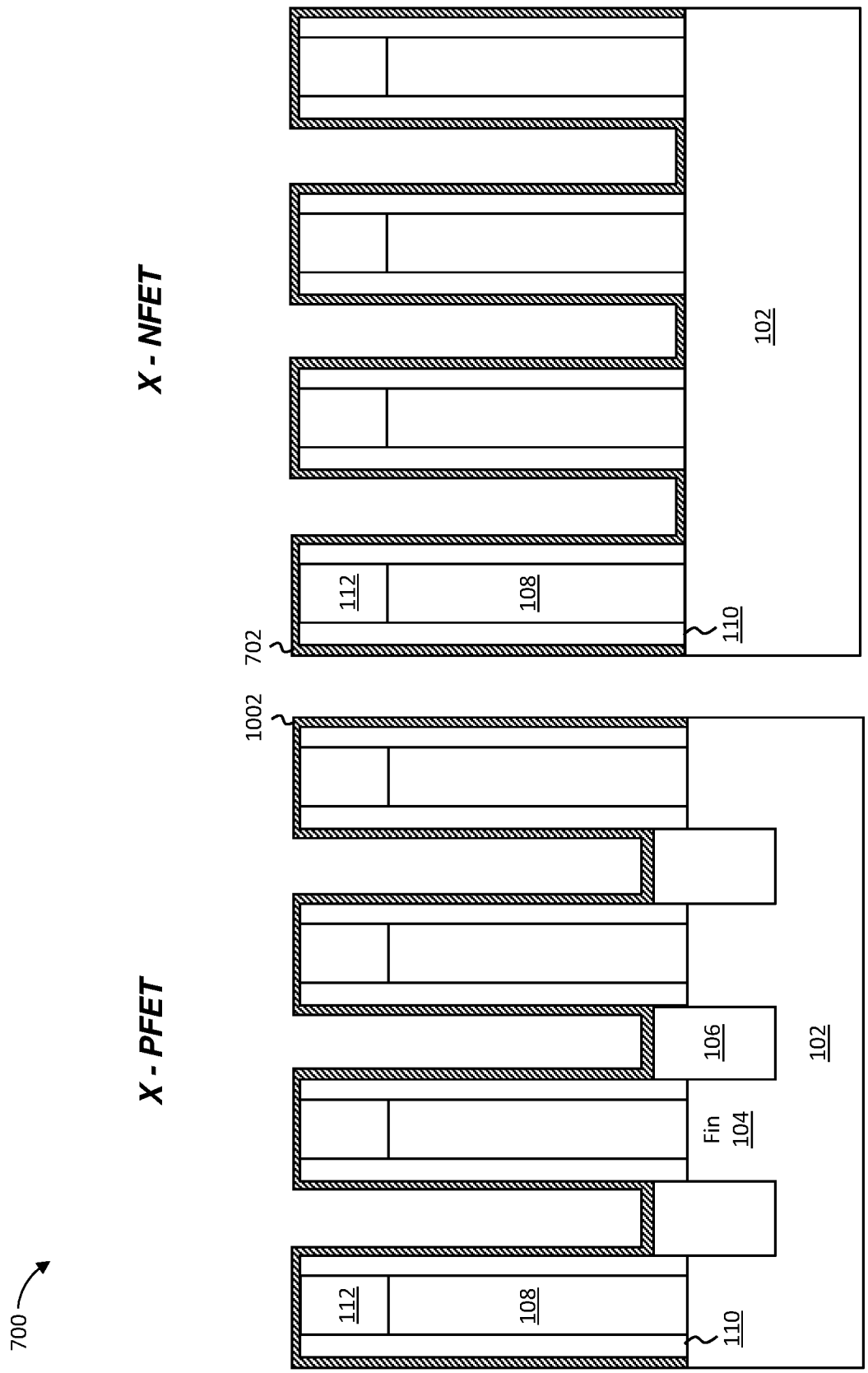

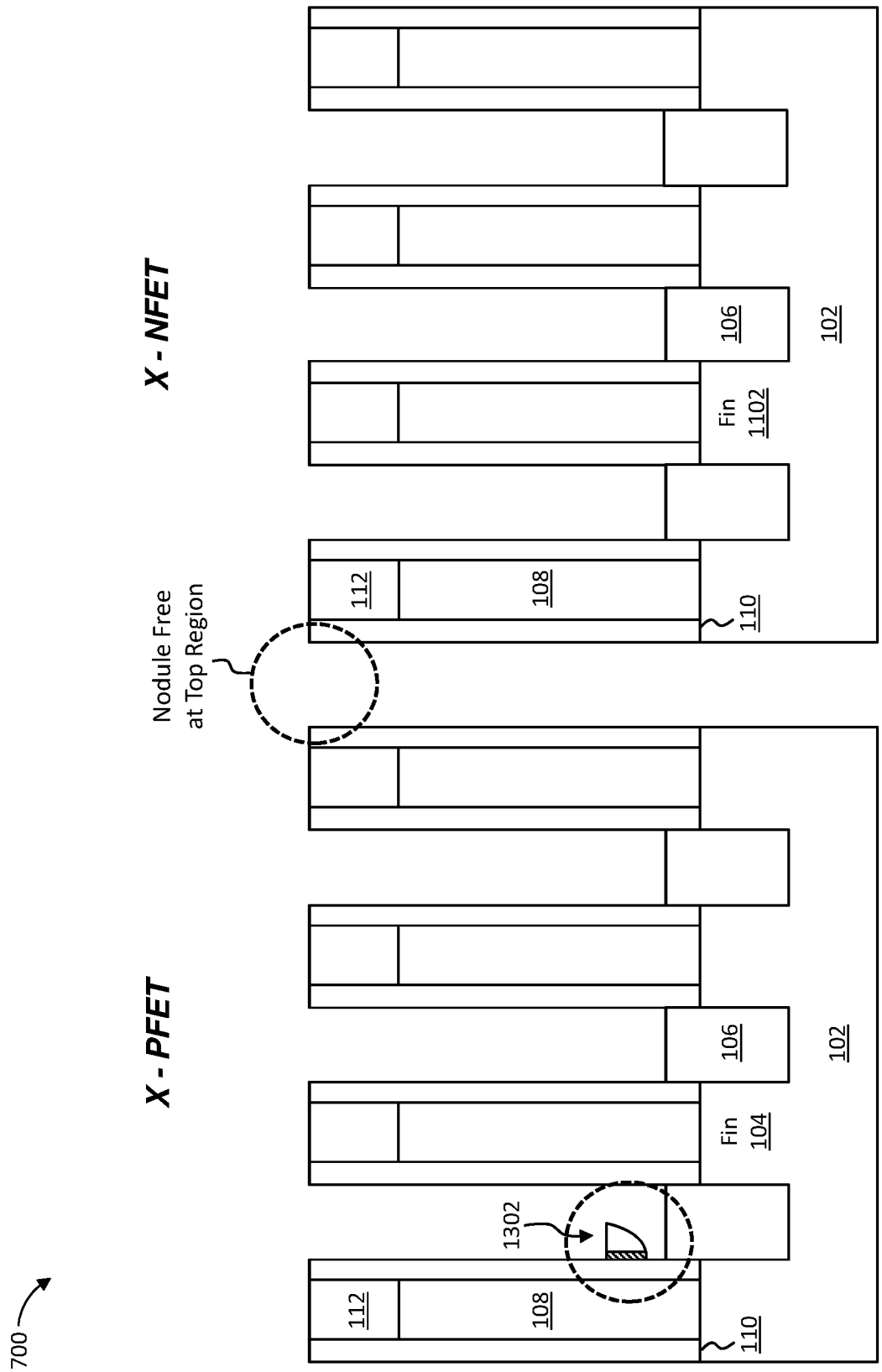

REMOVAL OF EPITAXY DEFECTS IN TRANSISTORS

BACKGROUND

The present invention generally relates to fabrication methods and resulting structures for semiconductor devices, and more specifically, to the removal of epitaxy defect regions (or nodules) from transistor features such as dummy gates, hard masks, and spacers.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. Some nonplanar transistor architectures, such as fin-type field effect transistors (finFETs) and nanosheet field effect transistors (NSFETs), employ semiconductor channels with various replacement metal gate (RMG) and gate-all-around (GAA) technologies to achieve increased device density, greater power efficiency, and some increased performance over lateral devices. In a finFET, for example, a gate runs along the sidewalls and top surface of each semiconductor fin, enabling fuller depletion in the channel region, and reducing short-channel effects due to steeper subthreshold swing (SS) and smaller drain induced barrier lowering (DIBL). Epitaxial growth processes are used to form many of the features (e.g., the source/drain) of these non-planar transistors.

SUMMARY

Embodiments of the invention are directed to a method for removing epitaxy defect regions (or nodules) from a semiconductor structure. A non-limiting example of the method includes forming a sacrificial gate over a channel region of a fin. The sacrificial gate can include a gate hard mask and a spacer. A source or drain region is formed adjacent to the channel region, resulting in a defect region being formed on a surface of the gate hard mask or the spacer. An organic planarization layer (OPL) is formed on a surface of the source or drain region and the defect region is removed. The defect region can be removed selective to the gate hard mask, the spacer, and/or the OPL.

Embodiments of the invention are directed to a method for removing epitaxy defect regions from a semiconductor structure. A non-limiting example of the method includes forming a first fin in a first region of a substrate and a second fin in a second region of the substrate. A first sacrificial gate is formed over a channel region of the first fin. The first sacrificial gate can include a first gate hard mask and a first spacer. A second sacrificial gate is formed over a channel region of the second fin. The second sacrificial gate can include a second gate hard mask and a second spacer. A first liner is formed on a surface of the second sacrificial gate and a surface of the substrate in the second region. A first source or drain region is formed adjacent to the channel region of the first fin, resulting in a defect region being formed on a surface of the first gate hard mask or the first spacer. An OPL is formed on a surface of the first source or drain region and the defect region is removed.

Embodiments of the invention are directed to a semiconductor structure. A non-limiting example of the semiconductor device includes a first fin in a first region of a substrate. A first gate is formed over a channel region of the first fin. The first gate includes a first spacer. A defect region is adjacent to a surface of the first spacer. The defect region lies on a first liner that sits between the defect region and the surface of the first spacer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 10A depicts a cross-sectional view of a PFET region of a semiconductor structure after a processing operation according to one or more embodiments of the invention;

FIG. 10B depicts a cross-sectional view of an NFET region of the semiconductor structure shown in FIG. 10A;

FIG. 14A depicts a cross-sectional view of a PFET region of a semiconductor structure after a processing operation according to one or more embodiments of the invention;

FIG. 14B depicts a cross-sectional view of an NFET region of the semiconductor structure shown in FIG. 14A;

Figure 1:
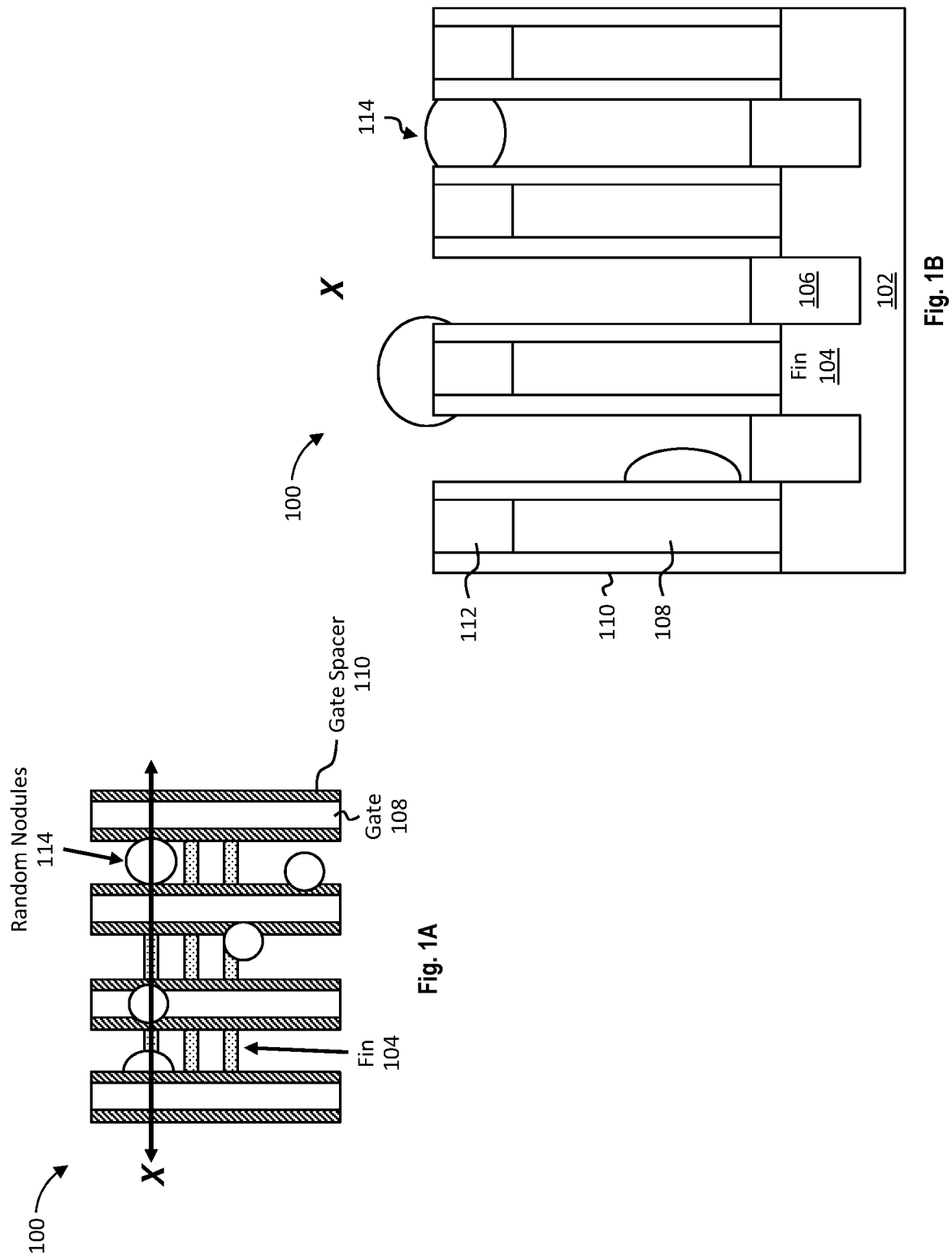
FIG. 1A depicts a top-down view of a semiconductor structure after a processing operation according to one or more embodiments of the invention.
FIG. 1B depicts a cross-sectional view of the semiconductor structure shown in FIG. 1A, taken along line X thereof.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, epitaxial growth is a well-controlled layer-by-layer deposition process used to form various features of a transistor. Conventional front end of line (FEOL) finFET fabrication processes include an epitaxy module during which source/drain regions are epitaxially grown between sacrificial gate spacers. The epitaxial growth processes used to form source/drain regions in this manner can result in inadvertently forming unwanted, random epitaxy defect regions on the sacrificial gate, hard mask and spacers. These defect regions are commonly referred to as epitaxy nodules, or simply, epi nodules. Epi nodules hinder the planarization process that follows the sacrificial gate open process (i.e., the poly open). This in turn creates gate height non-uniformities and the potential for incomplete gate cuts or incomplete poly pulls due to residual oxides. Epi nodules can also affect later contact reactive ion etches (RIEs) and can even prevent contact opens to the source/drain epitaxy during the middle of line (MOL).

Turning now to an overview of aspects of the present invention, one or more embodiments of the invention address the above-described shortcomings of the prior art by providing a selective epi nodule etch process. Advantageously, this epi nodule etch can be incorporated within conventional fabrication workflows. The epi nodule etch process can occur, for example, prior to the sacrificial gate open. During this epi nodule etch process the active source/drain epitaxies are blocked and the epi nodules are selectively etched. Blocking the active source/drain epitaxies prevents etching of the active regions during the epi nodule removal.

Turning now to a more detailed description of aspects of the present invention, FIG. 1A depicts a top-down view of a semiconductor structure 100 during an intermediate operation of a method of fabricating a final semiconductor device according to one or more embodiments of the invention. FIG. 1B depicts a cross-sectional view of the semiconductor structure 100 taken along the line "X" of FIG. 1A. In embodiments of the invention, the final semiconductor device can be a variety of types of MOSFETs, including, for example, planar and non-planar n-type field effect transistors (NFET) and p-type field effect transistors (PFET). For example, the final semiconductor device can be an n-type finFET or a p-type finFET. In the embodiment shown in FIG. 1, the semiconductor structure 100 includes a substrate 102 having one or more fins 104.

As shown in FIG. 1B, the substrate 102 and the fins 104 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 102 and the fins 104 can be made of a same semiconductor material. In other embodiments of the invention, the substrate 102 can be made of a first semiconductor material and the fins 104 can be made of a second semiconductor material. In some embodiments of the invention, the substrate 102 and the fins 104 can be made of silicon or SiGe. In some embodiments of the invention, the substrate 102 is a silicon substrate and the fins 104 are silicon germanium fins having a germanium concentration of about 10 to about 80 percent. The fins 104 can each have a height ranging from 4 nm to 150 nm. In some embodiments of the present invention, the fins 104 are formed to a height of about 60 nm, although other fin heights are within the contemplated scope of the invention.

In some embodiments of the invention, the substrate 102 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. The semiconductor structure 100 can be electrically isolated from other regions of the substrate 102 by a shallow trench isolation region (not depicted).

In some embodiments of the invention, source and drain regions 106 can be epitaxially grown on exposed surfaces of the substrate 102. In some embodiments of the invention, the source and drain regions 106 are formed to a thickness of about 4 nm to about 20 nm, for example 10 nm, although other thicknesses are within the contemplated scope of the invention.

Semiconductor materials can be epitaxially grown using, for example, vapor-phase epitaxy (VPE), molecular beam epitaxy (MBE), liquid-phase epitaxy (LPE), or other suitable processes. The source and drain regions 106 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., phosphorus or arsenic) or p-type dopants (e.g., Ga, B, $BF_2$, or Al). In some embodiments of the invention, the source and drain regions 106 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

In some embodiments of the invention, the source and drain regions 106 are made of silicon germanium. In some embodiments of the invention, the source and drain regions 106 are made of silicon germanium having a germanium concentration of about 10 to about 65 percent, for example, 50 percent, although other germanium concentrations are within the contemplated scope of the invention. In some embodiments of the invention, the source and drain regions 106 are SiGe:B (boron doped silicon germanium) regions, although other dopants are within the contemplated scope of the invention.

In some embodiments of the invention, a surface of the substrate 102 can be recessed prior to forming the source and drain regions 106. In some embodiments of the invention, the substrate 102 is recessed and the source and drain regions 106 are epitaxially grown above a topmost recessed surface of the substrate 102, between opposite sidewalls of two adjacent fins of the fins 104. In some embodiments of the invention of the invention, the source and drain regions 106 can extend above and below the topmost surface of the substrate 102 and/or the fins 104.

As illustrated in FIGS. 1A and 1B, one or more sacrificial gates 108 (sometimes referred to as dummy gates) can be formed over channel regions of the fins 104. The sacrificial gates 108 can be made of any suitable sacrificial material, such as, for example, amorphous silicon or polysilicon. The sacrificial gates 108 can be formed using any known method for patterning a sacrificial gate, such as, for example, a polysilicon fill and a sidewall image transfer with an anisotropic RIE. In some embodiments of the invention, the sacrificial gates 108 are replaced by conductive gates (not depicted) during a later replacement metal gate (RMG) process.

In some embodiments of the invention, spacers 110 (also known as sidewall spacers or gate spacers) are formed on sidewalls of the sacrificial gates 108. In some embodiments of the invention, the spacers 110 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 110. The spacers 110 can be made of any suitable material, such as, for example, a low-k dielectric, a nitride, silicon nitride, silicon oxide, SiON, SiC, SiOCN, or SiBCN. In some embodiments of the invention, the spacers 110 include silicon nitride. The spacers 110 can be formed to a thickness of about 5 to 10 nm, although other thicknesses are within the contemplated scope of the invention.

In some embodiments of the invention, a hard mask 112 (also known as a gate hard mask) is formed on each of the sacrificial gates 108. The hard mask 112 can be made of any suitable material, such as, for example, a silicon nitride. In some embodiments of the invention, a second hard mask (not depicted) is formed on the hard mask 112, to form a bilayer hard mask. The second hard mask can include an oxide, such as, for example, a silicon oxide. In some embodiments of the invention, the sacrificial gates 108 are formed by patterning the hard mask 112 and removing uncovered portions of the sacrificial gates 108.

As discussed previously herein, one or more epitaxy nodules 114 can be inadvertently formed on surfaces of the hard mask 112 and the spacers 110. This can occur, for example, while forming the source/drain epitaxies (i.e., the source and drain regions 106). While a particular set of epitaxy nodules 114 are illustrated for ease of discussion, it is understood that epitaxy nodules can form on any exposed portion of the hard mask 112, the spacers 110, and/or the source and drain regions 106. The epitaxy nodules 114 can vary in size and distribution.

Figure 2:
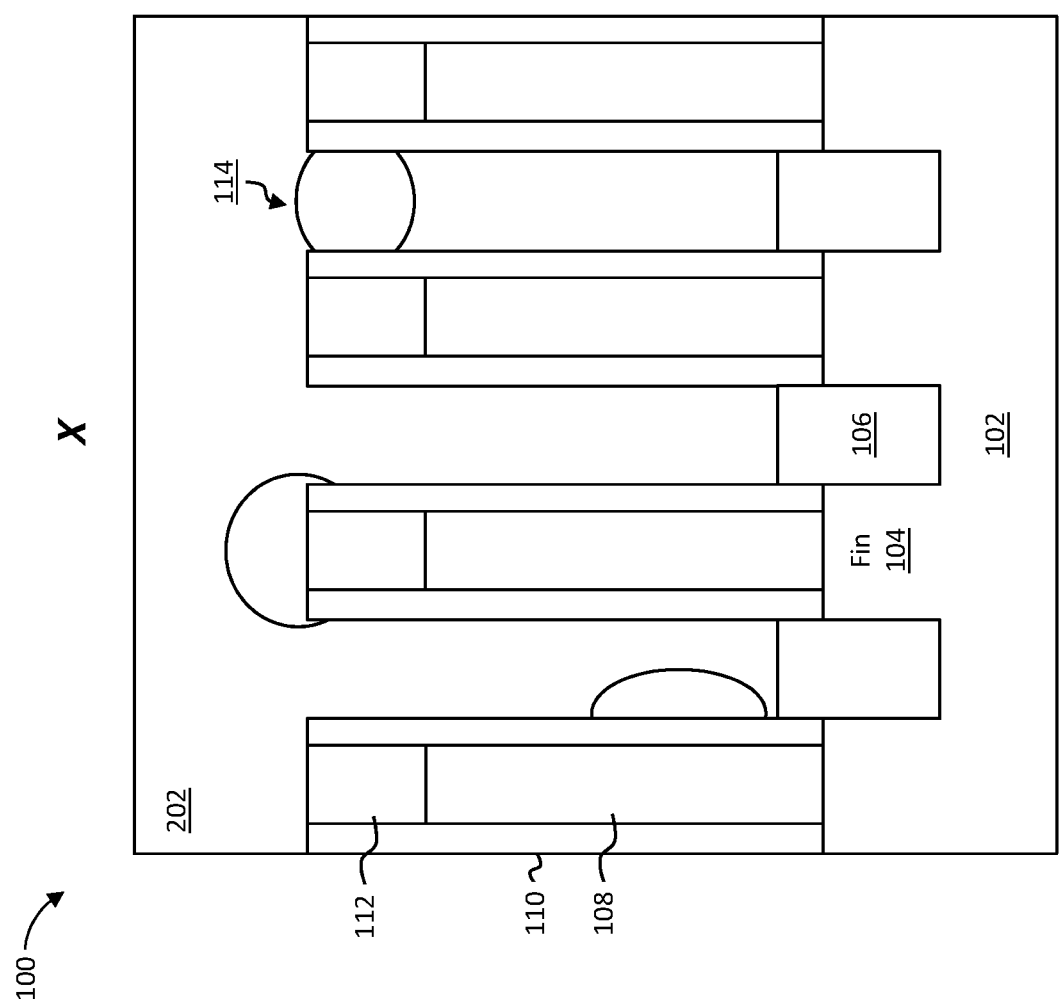
FIG. 2 depicts a cross-sectional view of a semiconductor structure after a processing operation according to one or more embodiments of the invention.

FIG. 2 depicts a cross-sectional view of the semiconductor structure 100 during an intermediate operation of a method of fabricating a final semiconductor device according to one or more embodiments of the invention. As illustrated in FIG. 2, an organic planarization layer (OPL) 202 can be formed over exposed surfaces of the source and drain regions 106. In this manner, the source and drain regions 106 can be protected from the downstream processes used to remove the epitaxy nodules 114.

The OPL 202 can be formed by a variety of methods, such as, for example, CVD, PECVD, UHVCVD, RTCVD, MOCVD, LRPCVD, ALD, PVD, chemical solution deposition, MBE, or other like process. In some embodiments of the invention, the OPL 202 can be applied using, for example, spin coating technology. The OPL 202 can be made from any suitable OPL material. In some embodiments of the invention, the OPL 202 can include a photo-sensitive organic polymer having a light-sensitive material that, when exposed to electromagnetic (EM) radiation, is chemically altered. In other words, the OPL 202 can be configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). In some embodiments of the invention, the OPL 202 can include any organic polymer and/or a photo-active compound having a molecular structure that can attach to the molecular structure of the organic polymer. In some embodiments of the invention, the OPL 202 is overfilled above a surface of the hard mask 112 and planarized, using, for example, a chemical-mechanical planarization (CMP) process. In some embodiments of the invention, the OPL 202 is deposited to a thickness sufficient to ensure that any exposed surface of the source and drain regions 106 is covered.

Figure 3:
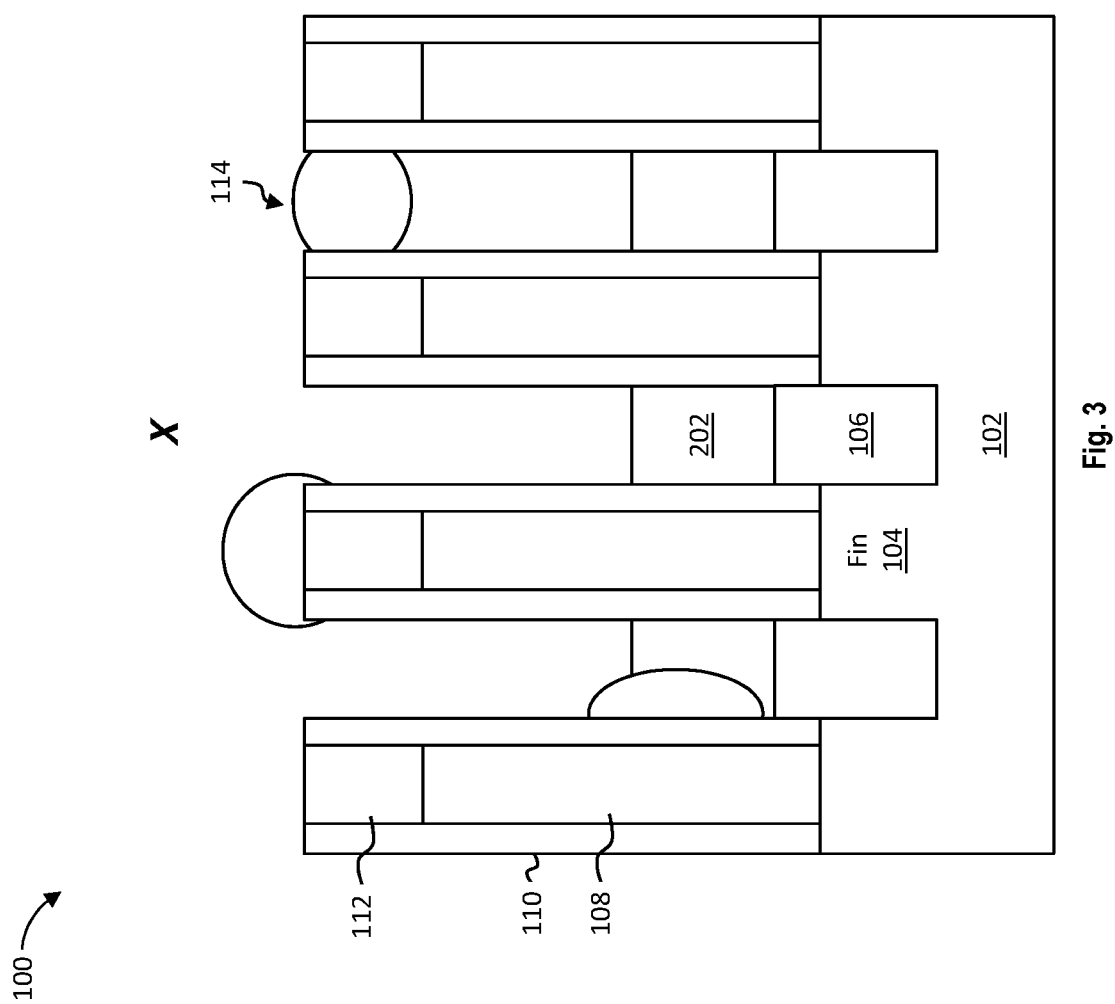
FIG. 3 depicts a cross-sectional view of a semiconductor structure after a processing operation according to one or more embodiments of the invention.

FIG. 3 depicts a cross-sectional view of the semiconductor structure 100 during an intermediate operation of a method of fabricating a final semiconductor device according to one or more embodiments of the invention. As illustrated in FIG. 3, the OPL 202 can be recessed to expose sidewalls of the spacers 110 and a surface of the hard mask 112. Recessing the OPL 202 also exposes the epitaxy nodules 114.

The OPL 202 can be recessed using any suitable method, such as a wet etch, a dry etch, or a combination of sequential wet and/or dry etches. For example, the OPL 202 can be recessed using a RIE or plasma ash. In some embodiments of the invention, the OPL 202 is removed selective to the spacers 110 and the hard mask 112. The OPL 202 can be recessed to any desired height above a surface of the source and drain regions 106. Recessing the OPL 202 closer to the surface of the source and drain regions 106 maximizes the number of epitaxy nodules 114 that will be removed or partially removed during the selective epitaxy nodule etch (see FIG. 4). Some margin is required, however, to ensure that the surface of the source and drain regions 106 remain covered by the OPL 202. In some embodiments of the invention, the OPL 202 is recessed to a height of about 5 nm to 20 nm above the surface of the source and drain regions 106, although other recessed heights are within the contemplated scope of the invention.

Figure 4:
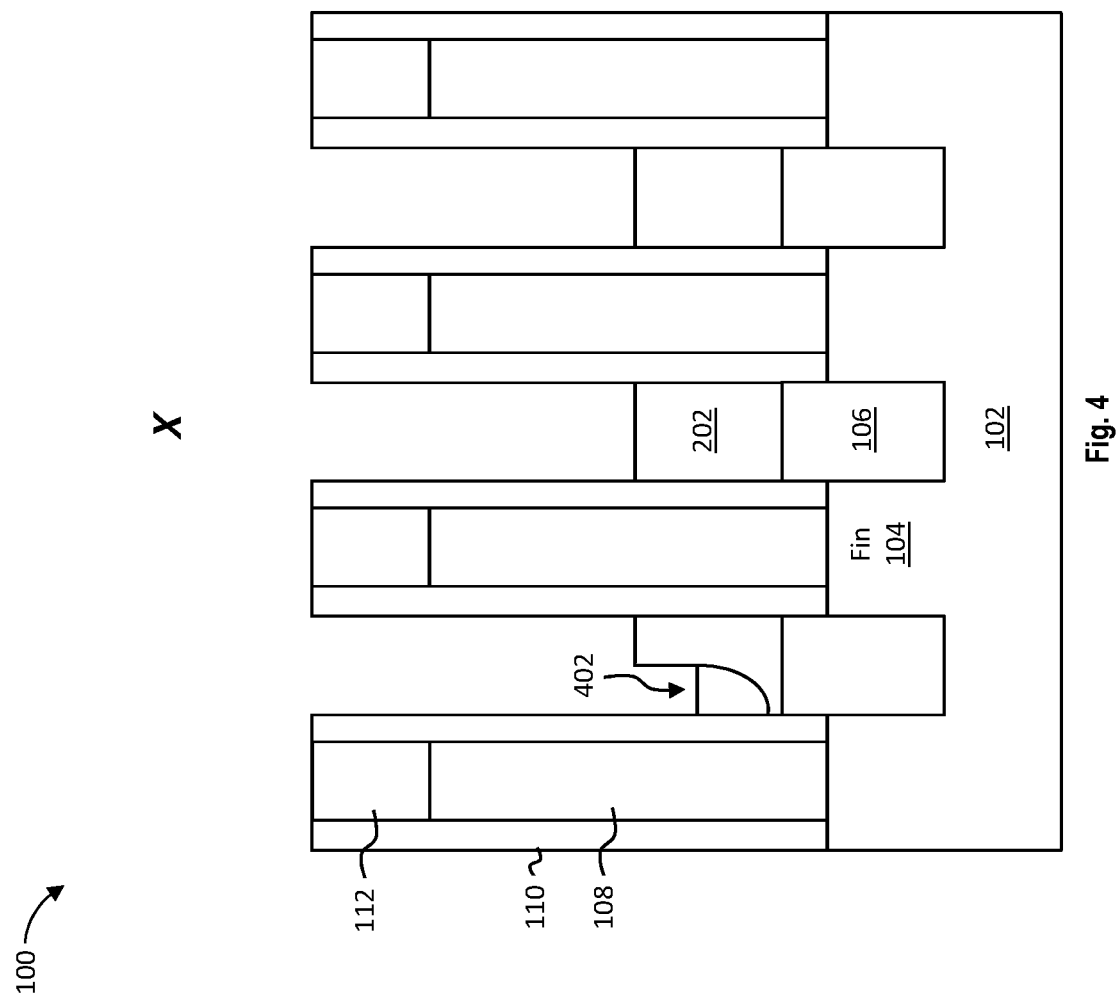
FIG. 4 depicts a cross-sectional view of a semiconductor structure after a processing operation according to one or more embodiments of the invention.

FIG. 4 depicts a cross-sectional view of the semiconductor structure 100 during an intermediate operation of a method of fabricating a final semiconductor device according to one or more embodiments of the invention. As illustrated in FIG. 4, the epitaxy nodules 114 can be removed using a selective epitaxy nodule etch. The selective epitaxy nodule etch can include a wet etch, a dry etch, or a combination of sequential wet and/or dry etches. Any suitable process can be used, so long as the etch is selective to the spacers 110, the hard mask 112, and/or the OPL 202. For example, the epitaxy nodules 114 can be removed using a RIE selective to the spacers 110, the hard mask 112, and the OPL 202.

In some embodiments of the invention, a partially etched nodule 402 remains in the semiconductor structure 100 after the selective epitaxy nodule etch. This can occur when the OPL 202 partially covers one of the epitaxy nodules 114. As discussed previously herein, the OPL 202 is recessed close to the surface of the source and drain regions 106 (within some tolerance). Consequently, any partially etched nodule 402 will be confined to a region near the surface of the source and drain regions 106. In other words, the semiconductor structure 100 will be nodule-free above the recessed surface of the OPL 202. This will ensure gate height uniformity and minimizes the potential for incomplete gate cuts or incomplete poly pulls due to residual oxides. Any remaining nodules (i.e., the partially etched nodule 402) at the bottom of the sacrificial gates 108 will not impact the gate height uniformity, but can impart a resistance (Rory) variation for that device.

Figure 5:
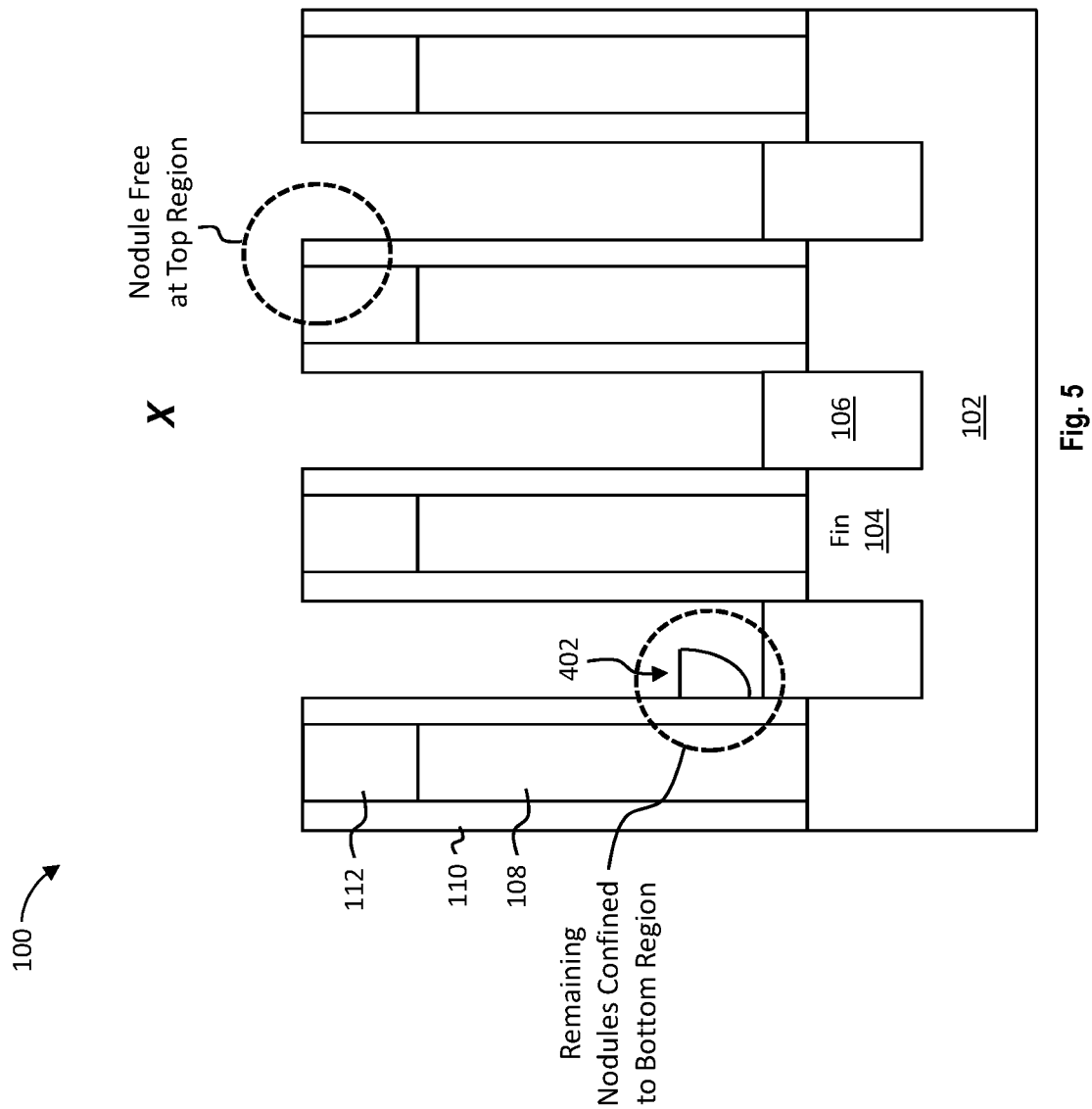
FIG. 5 depicts a cross-sectional view of a semiconductor structure after a processing operation according to one or more embodiments of the invention.

FIG. 5 depicts a cross-sectional view of the semiconductor structure 100 during an intermediate operation of a method of fabricating a final semiconductor device according to one or more embodiments of the invention. As illustrated in FIG. 5, the OPL 202 can be removed to expose a surface of the source and drain regions 106. The OPL 202 can be removed using any suitable process known for removing OPL layers, such as, for example, a plasma ash. As illustrated in FIG. 5, the resulting semiconductor structure 100 is nodule-free at a top region (e.g., above a top surface of the sacrificial gate 108), while any remaining nodules are confined to a bottom region (e.g., near the surface of the source and drain regions 106).

Figure 6:
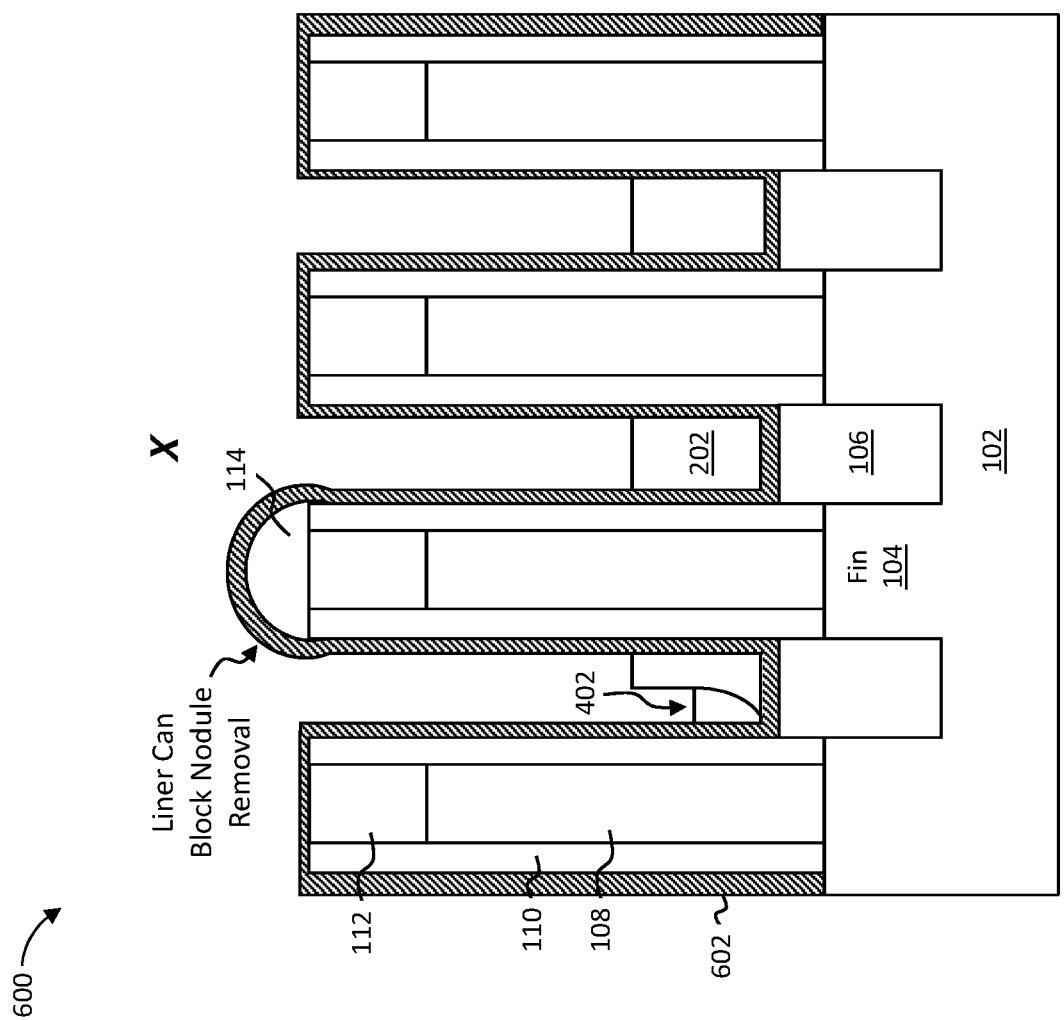
FIG. 6 depicts a cross-sectional view of a semiconductor structure after a processing operation according to one or more embodiments of the invention.

FIG. 6 depicts a cross-sectional view of a semiconductor structure 600 during an intermediate operation of a method of fabricating a final semiconductor device according to one or more embodiments of the invention. Semiconductor structure 600 illustrates an alternative embodiment to the semiconductor structure 100, whereby a liner 602 is formed over the spacers 110, the hard mask 112, and the source and drain regions 106. This can be the case where a PFET region (or NFET region) of the substrate 102 is blocked so that an NFET region (or PFET region) of the substrate 102 can be subjected to separate process conditions, such as when providing different source/drain epitaxies in the PFET and NFET regions. The semiconductor structure 600 is otherwise similar to the semiconductor structure 100. As illustrated in FIG. 6, the liner 602 can prevent removal of the epitaxy nodules 114.

In some embodiments of the invention, the liner 602 is formed using a CVD, PECVD, UHVCVD, RTCVD, MOCVD, LRPCVD, ALD, PVD, chemical solution deposition, MBE, or other like process. For example, dielectric material can be conformally deposited over the semiconductor structure 600. The liner 602 can be made of any suitable material, such as, for example, a low-k dielectric, a nitride, silicon nitride, silicon oxide, SiON, SiC, SiOCN, or SiBCN. In some embodiments of the invention, the liner 602 includes silicon nitride. The liner 602 can be formed to a thickness of about 5 to 10 nm, although other thicknesses are within the contemplated scope of the invention.

Figure 7B:
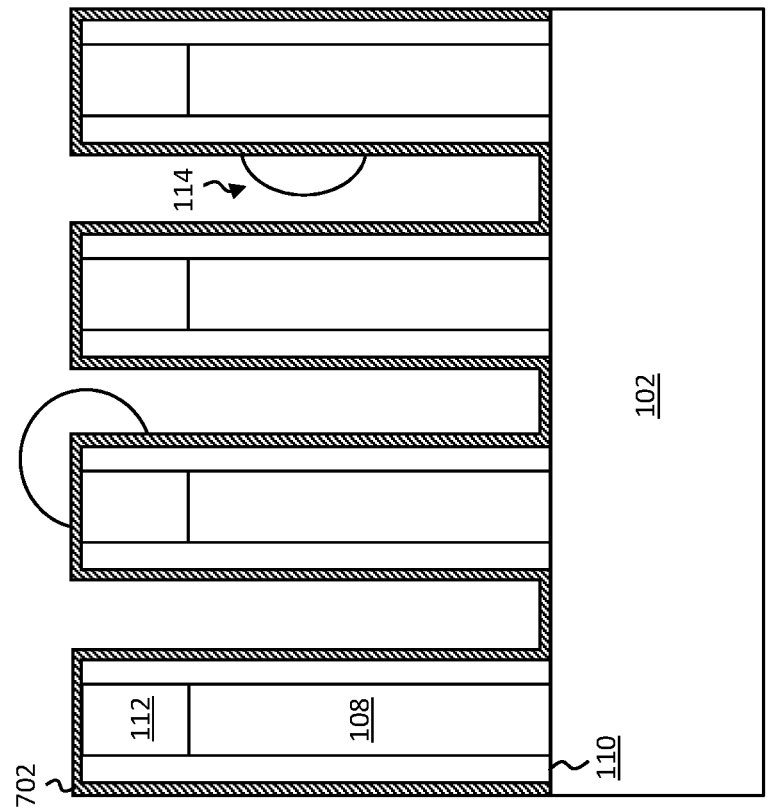
FIG. 7B depicts a cross-sectional view of an NFET region of the semiconductor structure shown in FIG. 7A.
Figure 7A:
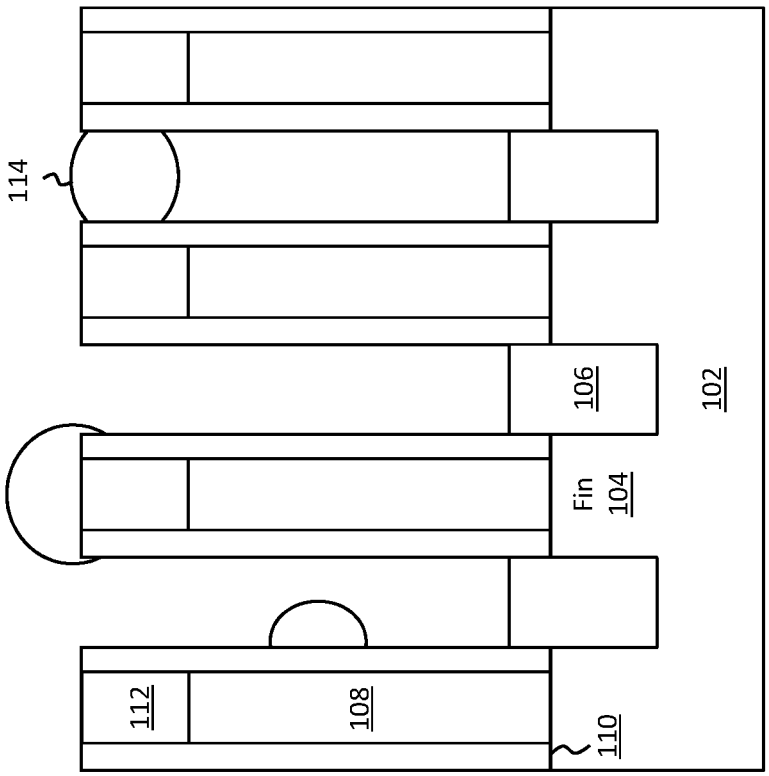
FIG. 7A depicts a cross-sectional view of a PFET region of a semiconductor structure after a processing operation according to one or more embodiments of the invention.

FIGS. 7A-13B depict cross-sectional views of a semiconductor structure 700 during an intermediate operation of a method of fabricating a final semiconductor device according to one or more embodiments of the invention. Semiconductor structure 700 illustrates an alternative embodiment to the semiconductor structure 100 that addresses the liner issue discussed previously with respect to FIG. 6. As illustrated in FIGS. 7A and 7B, the semiconductor structure 700 can include a substrate 102, fins 104, source and drain regions 106, sacrificial gates 108, spacers 110, and a gate hard mask 112. The semiconductor structure 700 can also include one or more epitaxy nodules 114. FIG. 7A depicts a first region (i.e., a PFET region) of the substrate 102, while FIG. 7B depicts a second region (i.e., an NFET region) of the substrate 102. Each of the substrate 102, fins 104, source and drain regions 106, sacrificial gates 108, spacers 110, and hard mask 112 can be made of a same material and in a similar manner as described with respect to the semiconductor structure 100.

As illustrated in FIG. 7B, a liner 702 was formed over the spacers 110, the hard mask 112, and a portion of the substrate 102 in the NFET region prior to forming the source and drain regions 106 in the PFET region. Consequently, epitaxy nodules 114 formed in the NFET region are formed on a surface of the liner 702. As discussed previously herein, the liner 702 protects the NFET region during PFET-specific process operations (e.g., forming p-type source and drain regions). Moreover, while depicted as a liner 702 formed in the NFET region to enable PFET-specific processing, it is understood that the liner 702 could instead be formed in the PFET region (prior to forming source and drain regions in the NFET region), so that the NFET region could be separately processed prior to the PFET region. The liner 702 can be made of a same material and in a similar manner as the liner 602 described with respect to the semiconductor structure 600.

Figure 8B:
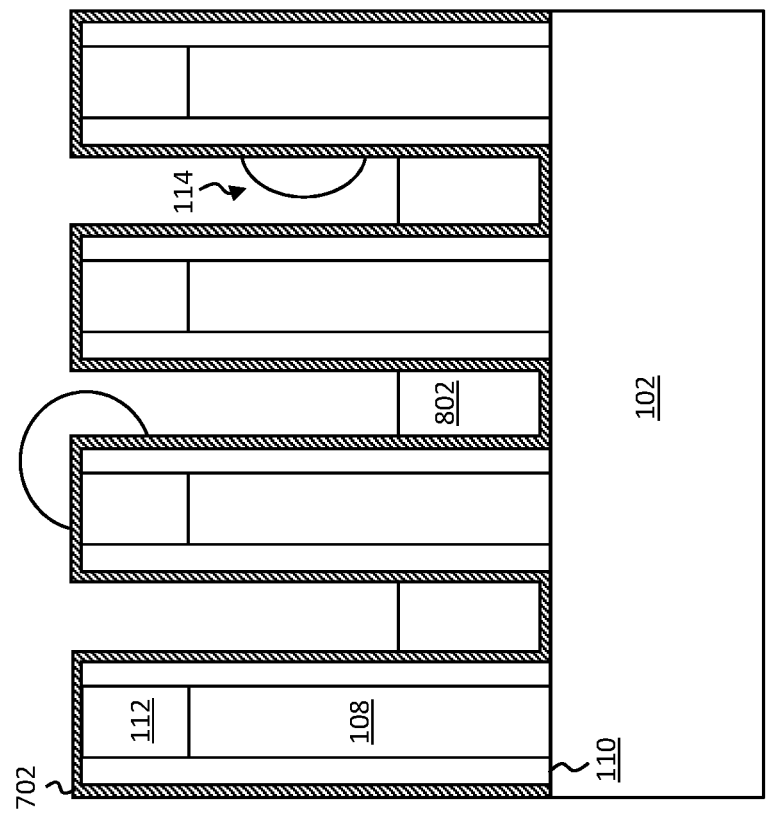
FIG. 8B depicts a cross-sectional view of an NFET region of the semiconductor structure shown in FIG. 8A.
Figure 8A:
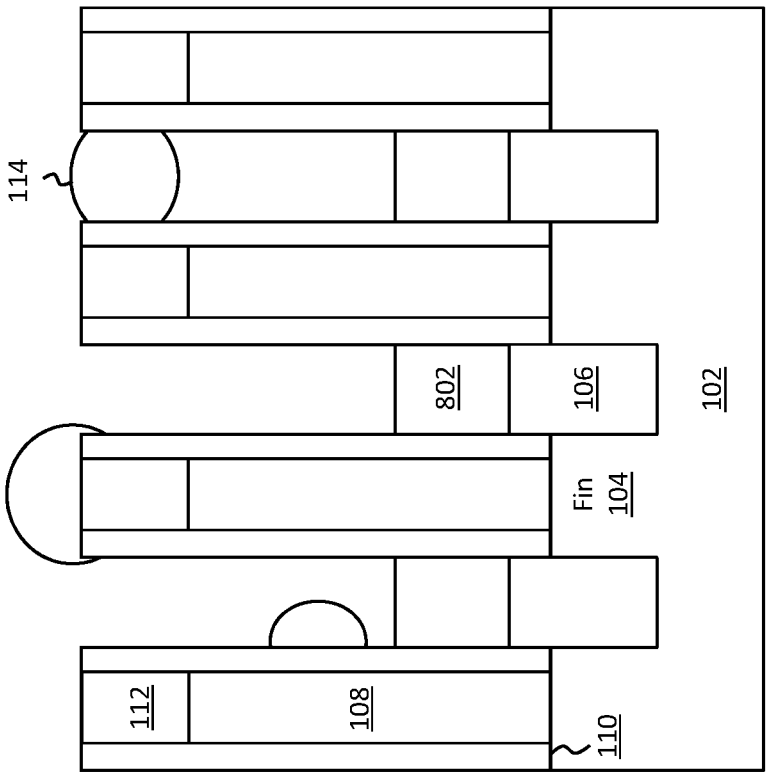
FIG. 8A depicts a cross-sectional view of a PFET region of a semiconductor structure after a processing operation according to one or more embodiments of the invention.

FIGS. 8A and 8B depict cross-sectional views of the semiconductor structure 700 during an intermediate operation of a method of fabricating a final semiconductor device according to one or more embodiments of the invention. As illustrated in FIGS. 8A and 8B, an OPL 802 can be formed over exposed surfaces of the source and drain regions 106 in the PFET region and over a surface of the liner 702 in the NFET region. In this manner, the source and drain regions 106 in the PFET region can be protected from the downstream processes used to remove the epitaxy nodules 114.

The OPL 802 can be formed in a similar manner as the OPL 202 described with respect to the semiconductor structure 100. For example, the OPL 802 can be formed by CVD, PECVD, UHVCVD, RTCVD, MOCVD, LRPCVD, ALD, PVD, chemical solution deposition, MBE, or other like process. In some embodiments of the invention, the OPL 802 can be applied using spin coating technology. The OPL 802 can be made from any suitable OPL material. In some embodiments of the invention, the OPL 802 can include a photo-sensitive organic polymer having a light-sensitive material that, when exposed to electromagnetic (EM) radiation, is chemically altered. In other words, the OPL 802 can be configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). In some embodiments of the invention, the OPL 802 can include any organic polymer and/or a photo-active compound having a molecular structure that can attach to the molecular structure of the organic polymer. In some embodiments of the invention, the OPL 802 is overfilled above a surface of the hard mask 112, planarized, and then recessed, in a similar manner as was described with respect to the OPL 202. In some embodiments of the invention, the OPL 802 is deposited to a thickness sufficient to ensure that any exposed surface of the source and drain regions 106 in the PFET region is covered.

Figures 9A, 9B:
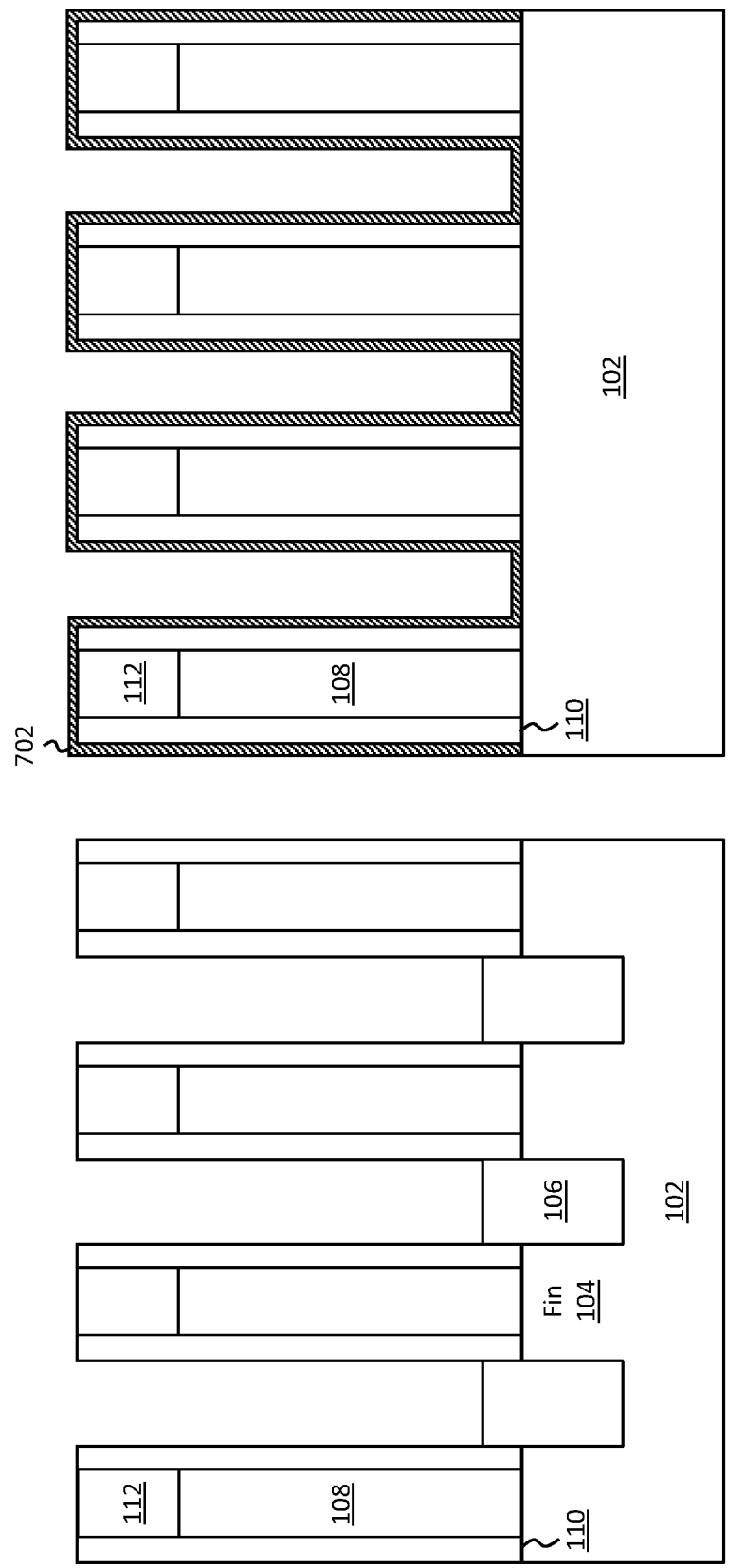
FIG. 9A depicts a cross-sectional view of a PFET region of a semiconductor structure after a processing operation according to one or more embodiments of the invention.
FIG. 9B depicts a cross-sectional view of an NFET region of the semiconductor structure shown in FIG. 9A.

FIGS. 9A and 9B depict cross-sectional views of the semiconductor structure 700 during an intermediate operation of a method of fabricating a final semiconductor device according to one or more embodiments of the invention. As illustrated in FIGS. 9A and 9B, the epitaxy nodules 114 and the OPL 802 can be removed to expose a surface of the source and drain regions 106 in the PFET region and a surface of the liner 702 in the NFET region.

The epitaxy nodules 114 can be removed in a similar manner as discussed with respect to the semiconductor structure 100. For example, the epitaxy nodules 114 can be removed using a selective epitaxy nodule etch. The selective epitaxy nodule etch can include a wet etch, a dry etch, or a combination of sequential wet and/or dry etches. In some embodiments of the invention, the nodule etch is selective to the spacers 110, the hard mask 112, the liner 702, and/or the OPL 802. In some embodiments of the invention, the epitaxy nodules 114 can be removed using a RIE selective to the spacers 110, the hard mask 112, the liner 702, and the OPL 202. In some embodiments of the invention, a partially etched nodule (not depicted) remains in the semiconductor structure 700 after the selective epitaxy nodule etch. The OPL 802 can be removed using any suitable process known for removing OPL layers, such as, for example, a plasma ash.

FIGS. 10A and 10B depict cross-sectional views of the semiconductor structure 700 during an intermediate operation of a method of fabricating a final semiconductor device according to one or more embodiments of the invention. As illustrated in FIG. 10A, a liner 1002 can be formed over the spacers 110, the hard mask 112, and the source and drain regions 106 in the PFET region. The liner 1002 can be made of a same material and in a similar manner as the liner 602 described with respect to the semiconductor structure 600. As discussed previously herein, the liner 1002 protects the PFET region during NFET-specific process operations (e.g., forming n-type source and drain regions, as depicted in FIG. 11B).

Figure 11A:
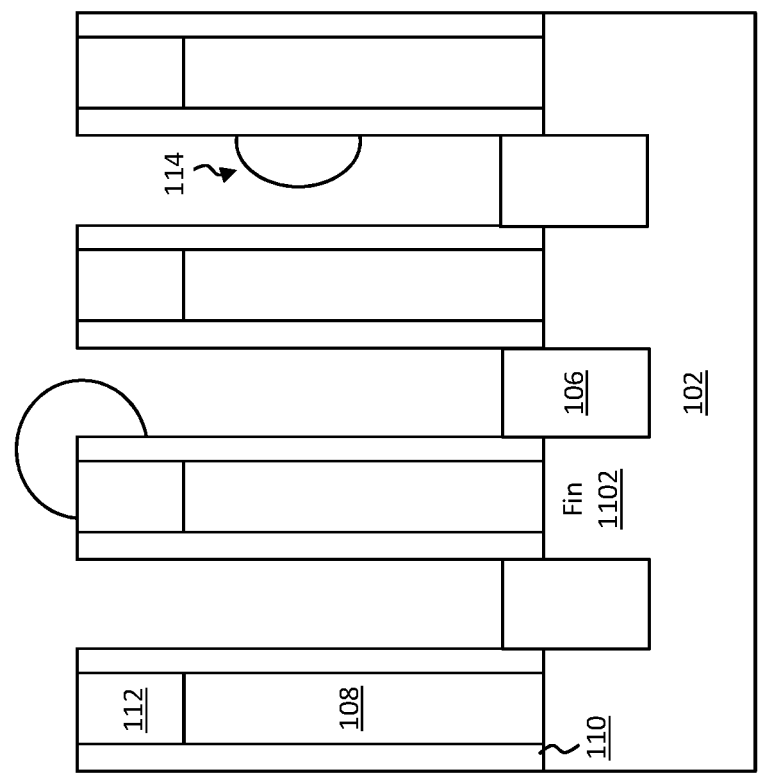
FIG. 11A depicts a cross-sectional view of a PFET region of a semiconductor structure after a processing operation according to one or more embodiments of the invention.
Figure 11B:
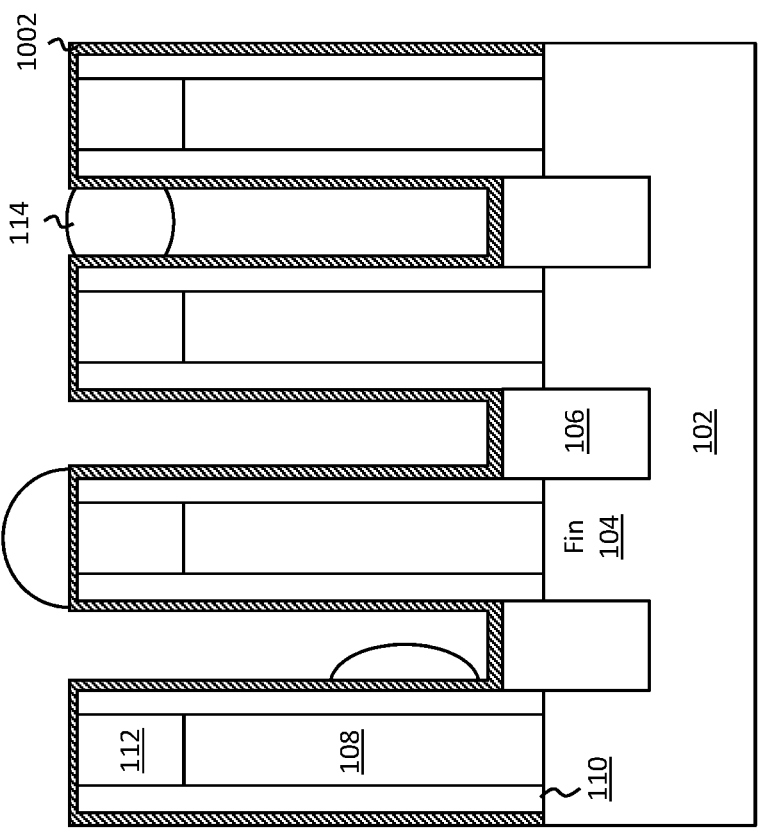
FIG. 11B depicts a cross-sectional view of an NFET region of the semiconductor structure shown in FIG. 11A.

FIGS. 11A and 11B depict cross-sectional views of the semiconductor structure 700 during an intermediate operation of a method of fabricating a final semiconductor device according to one or more embodiments of the invention. As illustrated in FIG. 11B, the liner 702 can be removed from the NFET region to expose a surface of the substrate 102. In some embodiments of the invention, source and drain regions 106 can be epitaxially grown on the exposed surfaces of the substrate 102 in the NFET region. In some embodiments of the invention, the source and drain regions 106 are formed to a thickness of about 4 nm to about 20 nm, for example 10 nm, although other thicknesses are within the contemplated scope of the invention.

In some embodiments of the invention, the exposed surface of the substrate 102 can be recessed in the NFET region to define fins 1102 prior to forming the source and drain regions 106. In some embodiments of the invention, the substrate 102 is recessed and the source and drain regions 106 are epitaxially grown above a topmost recessed surface of the substrate 102, between opposite sidewalls of two adjacent fins of the fins 1102. In some embodiments of the invention, the source and drain regions 106 can extend above and below the topmost surface of the substrate 102 and/or the fins 1102. In some embodiments of the invention, the source and drain regions 106 in the NFET region have an opposite doping type than the source and drain regions 106 in the PFET region. For example, the source and drain regions 106 can be p-type source/drains in the PFET region and n-type source/drains in the NFET region.

Figure 12B:
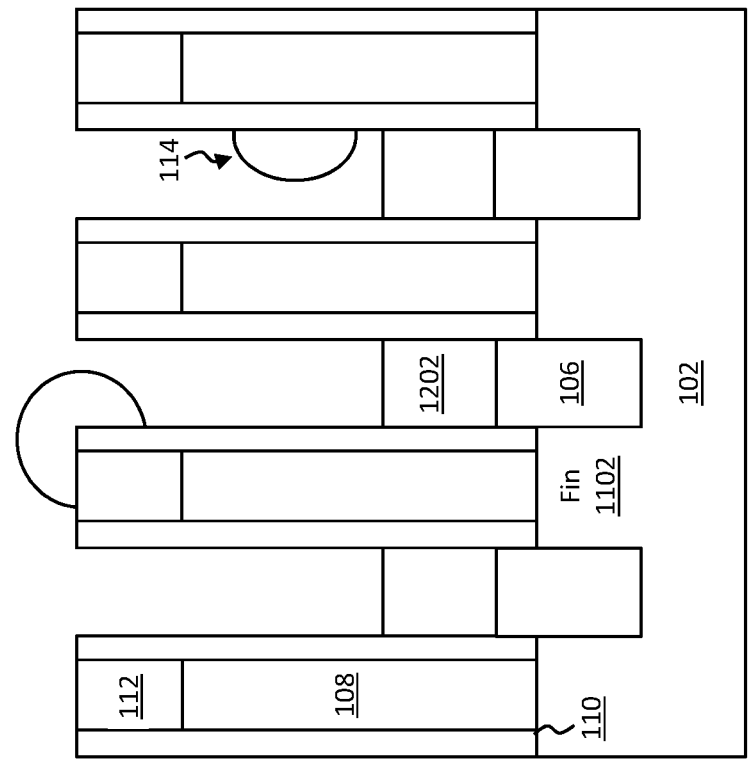
FIG. 12B depicts a cross-sectional view of an NFET region of the semiconductor structure shown in FIG. 12A.
Figure 12A:
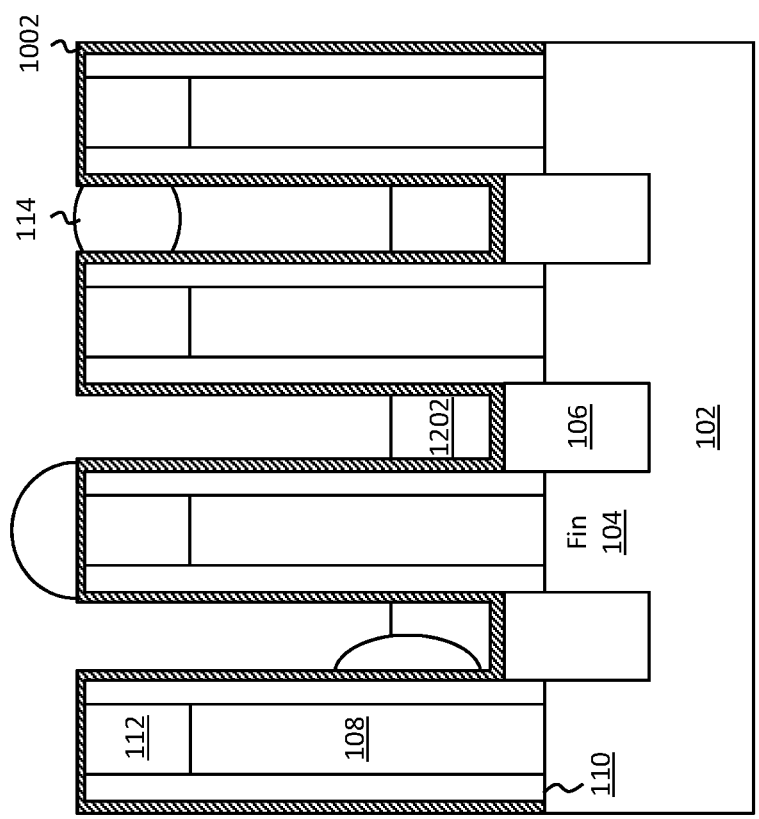
FIG. 12A depicts a cross-sectional view of a PFET region of a semiconductor structure after a processing operation according to one or more embodiments of the invention.

FIGS. 12A and 12B depict cross-sectional views of the semiconductor structure 700 during an intermediate operation of a method of fabricating a final semiconductor device according to one or more embodiments of the invention. As illustrated in FIGS. 12A and 12B, an OPL 1202 can be formed over exposed surfaces of the source and drain regions 106 in the NFET region and over a surface of the liner 1002 in the PFET region. In this manner, the source and drain regions 106 in the NFET region can be protected from the downstream processes used to remove the epitaxy nodules 114.

The OPL 1202 can be formed from a same material and in a similar manner as the OPL 202 described with respect to the semiconductor structure 100. For example, the OPL 1202 can be formed by CVD, PECVD, UHVCVD, RTCVD, MOCVD, LRPCVD, ALD, PVD, chemical solution deposition, MBE, or other like process. In some embodiments of the invention, the OPL 1202 can be applied using spin coating technology. In some embodiments of the invention, the OPL 1202 is overfilled above a surface of the hard mask 112, planarized, and then recessed, in a similar manner as was described with respect to the OPL 202. In some embodiments of the invention, the OPL 1202 is deposited to a thickness sufficient to ensure that any exposed surface of the source and drain regions 106 in the NFET region is covered.

Figure 13B:
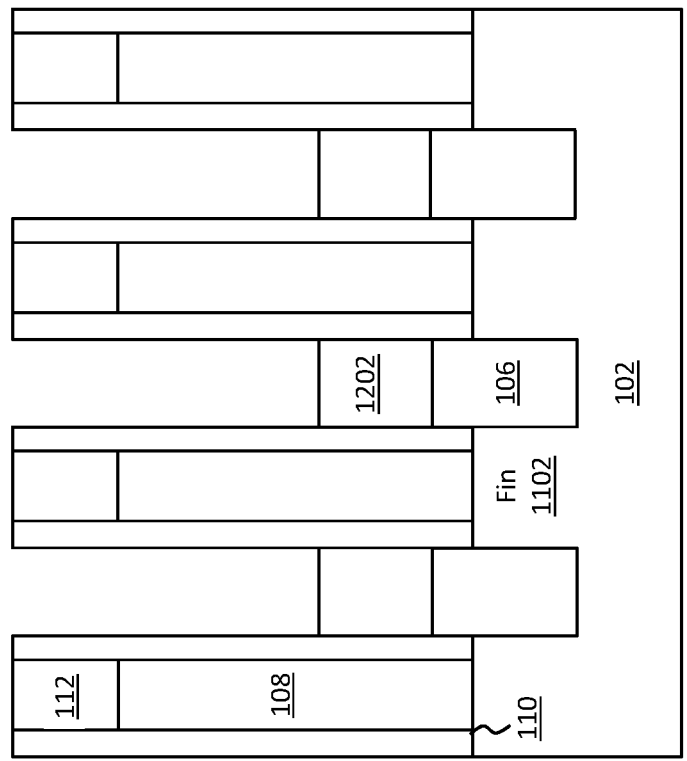
FIG. 13B depicts a cross-sectional view of an NFET region of the semiconductor structure shown in FIG. 13A.
Figure 13A:
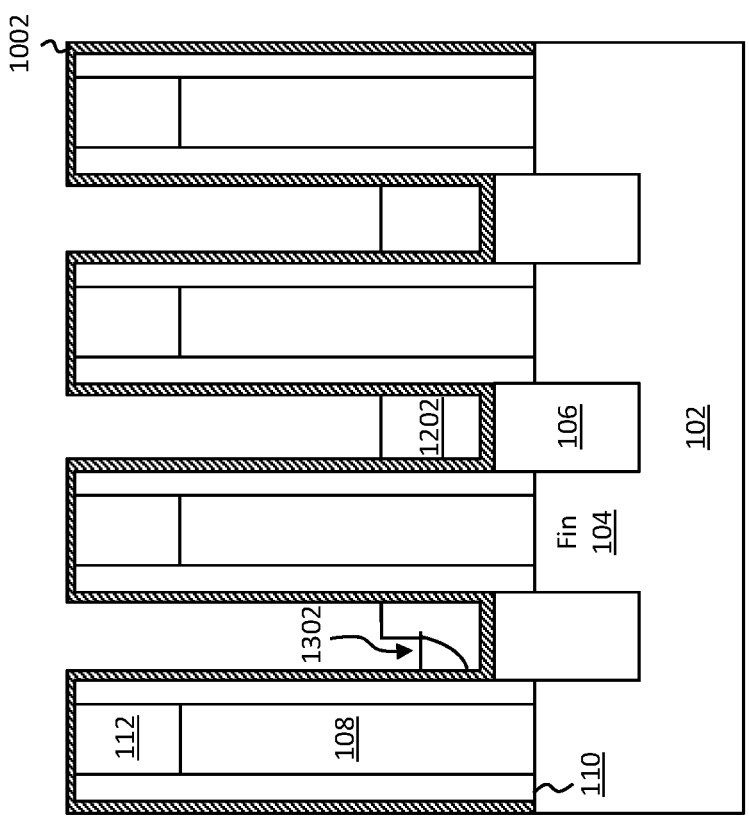
FIG. 13A depicts a cross-sectional view of a PFET region of a semiconductor structure after a processing operation according to one or more embodiments of the invention.

FIGS. 13A and 13B depict cross-sectional views of the semiconductor structure 700 during an intermediate operation of a method of fabricating a final semiconductor device according to one or more embodiments of the invention. As illustrated in FIGS. 13A and 13B, the epitaxy nodules 114 and the OPL 1202 can be removed. The epitaxy nodules 114 can be removed in a similar manner as discussed with respect to the semiconductor structure 100. For example, the epitaxy nodules 114 can be removed using a selective epitaxy nodule etch. The selective epitaxy nodule etch can include a wet etch, a dry etch, or a combination of sequential wet and/or dry etches. In some embodiments of the invention, the nodule etch is selective to the spacers 110, the hard mask 112, the liner 1002, and/or the OPL 1202. In some embodiments of the invention, the epitaxy nodules 114 can be removed using a RIE selective to the spacers 110, the hard mask 112, the liner 1002, and the OPL 1202.

As illustrated in FIGS. 13A and 13B, the resulting semiconductor structure 700 is nodule-free at a top region (e.g., above a top surface of the sacrificial gate 108), while any remaining nodules are confined to a bottom region (e.g., near the surface of the source and drain regions 106). In some embodiments of the invention, a partially etched nodule 1302 remains in the semiconductor structure 700 after the selective epitaxy nodule etch. As discussed previously herein, any partially etched nodule 1302 will be confined to a region near the surface of the source and drain regions 106. In other words, the semiconductor structure 700 will be nodule-free above the recessed surface of the OPL 1202. This will ensure gate height uniformity and minimizes the potential for incomplete gate cuts or incomplete poly pulls due to residual oxides. Any remaining nodules (i.e., the partially etched nodule 1302) at the bottom of the sacrificial gates 108 will not impact the gate height uniformity, but can impart a resistance (Rory) variation for that device.

FIGS. 14A and 14B depict cross-sectional views of the semiconductor structure 700 during an intermediate operation of a method of fabricating a final semiconductor device according to one or more embodiments of the invention. As illustrated in FIGS. 14A and 14B, the OPL 1202 can be removed to expose a surface of the source and drain regions 106 in the NFET region and a surface of the liner 1002 in the PFET region. The OPL 1202 can be removed using any suitable process known for removing OPL layers, such as, for example, a plasma ash. As further depicted in FIG. 14A, the liner 1002 can be removed from the PFET region to expose a surface of the substrate 102. The liner 1002 can be removed in a similar manner as the liner 702, as discussed with respect to FIGS. 11A and 11B. As discussed previously herein, in some embodiments of the invention, a partially etched nodule 1302 can remain in a bottom portion of the semiconductor structure 700. In some embodiments of the invention, a portion of the liner 1002 between the partially etched nodule 1302 and the spacers 110 is not removed, due to the presence of the partially etched nodule 1302.

Figure 15:
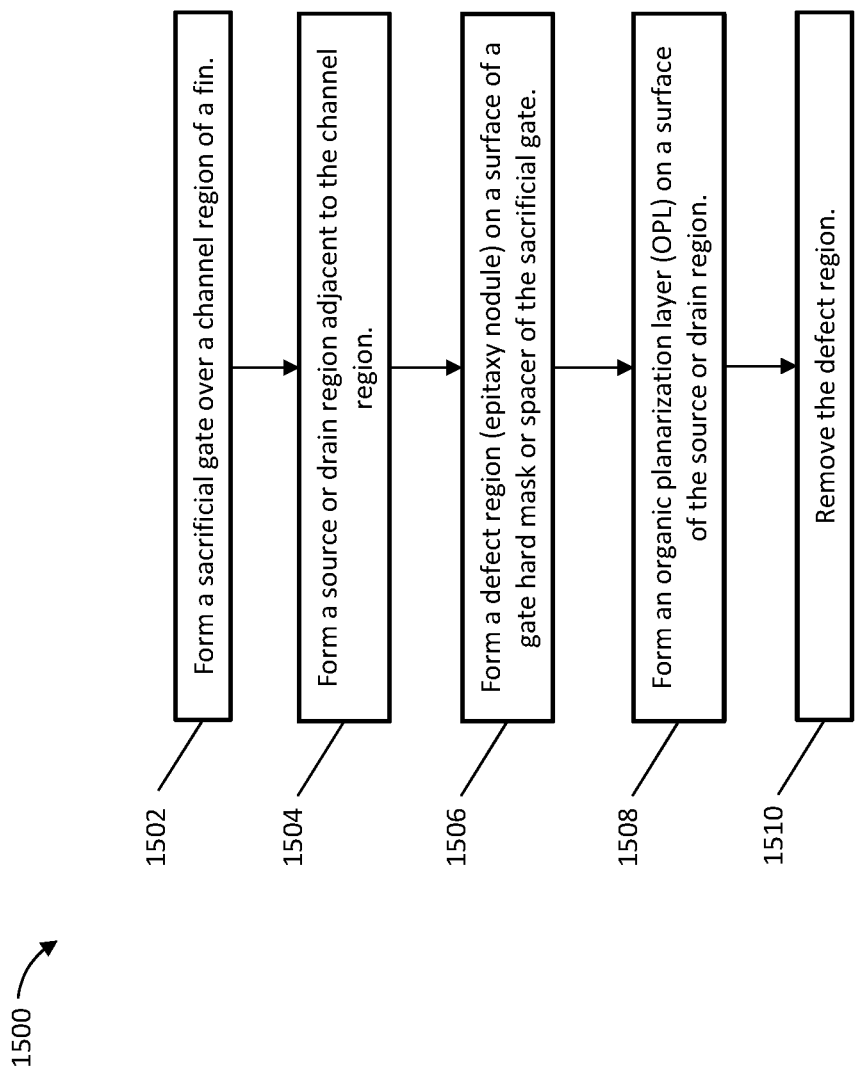
FIG. 15 depicts a flow diagram illustrating a method according to one or more embodiments of the invention.

FIG. 15 depicts a flow diagram 1500 illustrating a method for forming a semiconductor device according to one or more embodiments of the invention. As shown at block 1502, a sacrificial gate is formed over a channel region of a fin. The sacrificial gate can be made of a same material and in a similar manner as described with respect to the semiconductor structure 100, the semiconductor structure 600, or the semiconductor structure 700. The sacrificial gate can include a gate hard mask and a spacer. At block 1504, a source or drain region is formed adjacent to the channel region.

At block 1506, an epitaxy nodule is formed on a surface of the gate hard mask or the spacer. In some embodiments of the invention, the epitaxy nodule can be inadvertently formed while epitaxially growing the source or drain region.

At block 1508, an OPL is formed on a surface of the source or drain region. At block 1510, the epitaxy nodule is removed. As described previously herein, the OPL protects the source or drain region while removing the epitaxy nodule. The epitaxy nodule can be removed according to one or more embodiments of the invention, such as, for example, by a selective epitaxy nodule etch.

Figure 16:
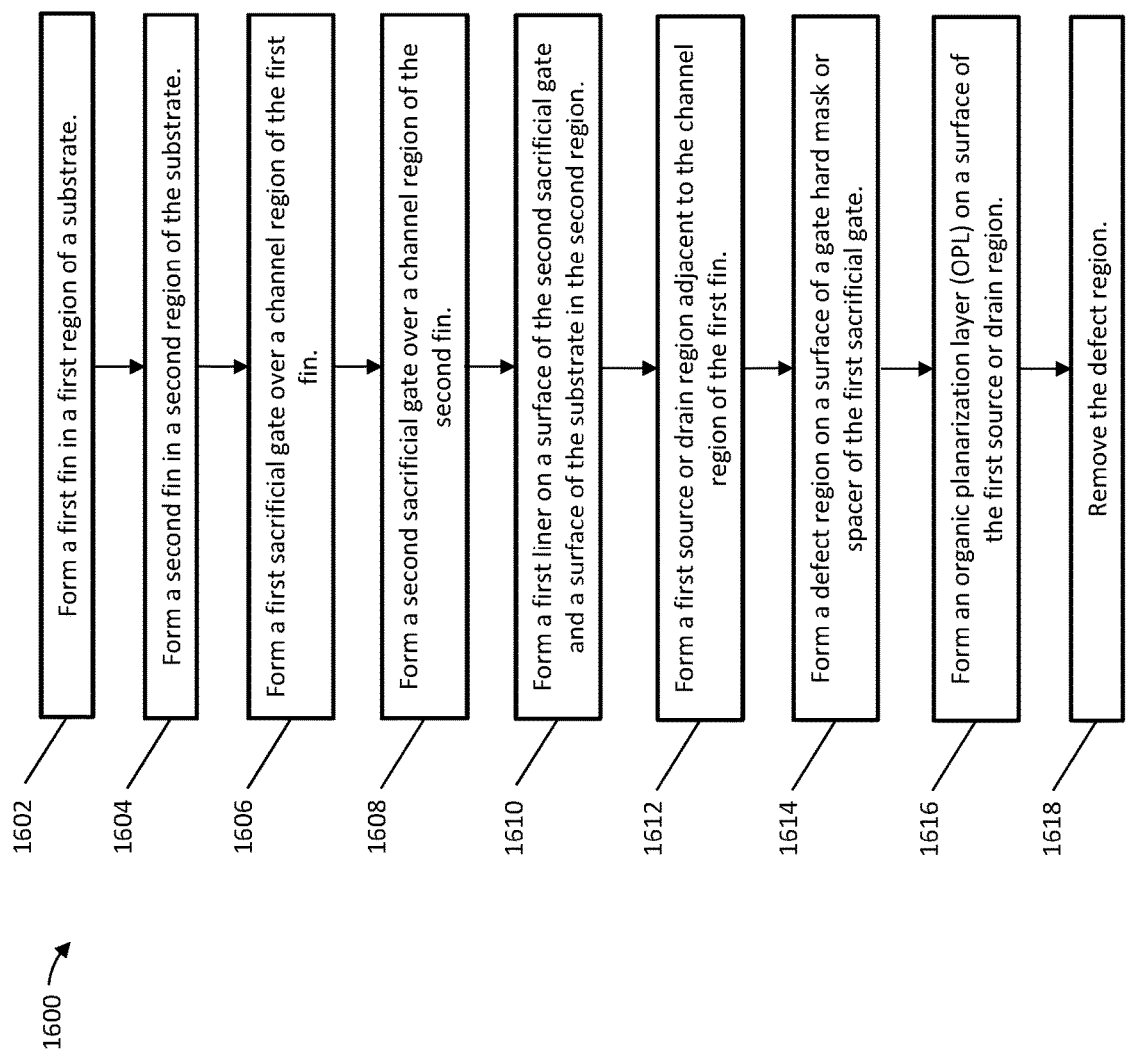
FIG. 16 depicts a flow diagram illustrating a method according to one or more embodiments of the invention.

FIG. 16 depicts a flow diagram 1600 illustrating a method for forming a semiconductor device according to one or more embodiments of the invention. As shown at block 1602, a first fin is formed in a first region of a substrate. At 1604, a second fin is formed in a second region of the substrate. At block 1606, a first sacrificial gate is formed over a channel region of the first fin. The first sacrificial gate can include a first gate hard mask and a first spacer. At block 1608, a second sacrificial gate is formed over a channel region of the second fin. The second sacrificial gate can include a second gate hard mask and a second spacer.

At block 1610, a first liner is formed on a surface of the second sacrificial gate and a surface of the substrate in the second region. The first liner can be made of a same material and in a similar manner as described with respect to the semiconductor structure 100, the semiconductor structure 600, or the semiconductor structure 700.

At block 1612, a first source or drain region is formed adjacent to the channel region of the first fin. At block 1614, an epitaxy nodule is formed on a surface of the first gate hard mask or the first spacer. In some embodiments of the invention, the epitaxy nodule can be inadvertently formed while epitaxially growing the first source or drain region.

At block 1616, an OPL is formed on a surface of the first source or drain region. At block 1618, the epitaxy nodule is removed. As described previously herein, the OPL protects the source or drain region while removing the epitaxy nodule. The epitaxy nodule can be removed according to one or more embodiments of the invention, such as, for example, by a selective epitaxy nodule etch.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a sacrificial gate over a channel region of a fin, the sacrificial gate comprising a gate hard mask and a spacer;
   forming a source or drain (S/D) region adjacent to the channel region;
   forming a defect region on a surface of the gate hard mask or the spacer;
   forming an organic planarization layer (OPL) on a surface of the S/D region; and
   removing the defect region.

2. The method of claim 1, wherein the defect region comprises an epitaxy nodule formed as a result of forming the source or drain region.

3. The method of claim 1 further comprising, prior to removing the defect region, recessing the OPL to expose a surface of the defect region.

4. The method of claim 1, wherein removing the defect region comprises a wet or dry etch.

5. The method of claim 1, wherein the wet or dry etch is selective to the gate hard mask or spacer.

6. A method for forming a semiconductor device, the method comprising:
   forming a first fin in a first region of a substrate;
   forming a second fin in a second region of the substrate;
   forming a first sacrificial gate over a channel region of the first fin, the first sacrificial gate comprising a first gate hard mask and a first spacer;
   forming a second sacrificial gate over a channel region of the second fin, the second sacrificial gate comprising a second gate hard mask and a second spacer;
   forming a first liner on a surface of the second sacrificial gate and a surface of the substrate in the second region;
   forming a first source or drain region adjacent to the channel region of the first fin;
   forming a defect region on a surface of the first gate hard mask or the first spacer;
   forming an organic planarization layer (OPL) on a surface of the first source or drain region; and
   removing the defect region.

7. The method of claim 6, wherein the defect region comprises an epitaxy nodule formed as a result of forming the first source or drain region.

8. The method of claim 6 further comprising, prior to removing the defect region, recessing the OPL to expose a surface of the defect region.

9. The method of claim 6, wherein removing the defect region comprises a wet or dry etch selective to the first gate hard mask or first spacer.

10. The method of claim 6 further comprising removing the OPL to expose a surface of the first source or drain region.

11. The method of claim 10 further comprising forming a second liner on a surface of the first sacrificial gate and the surface of the first source or drain region.

12. The method of claim 11, further comprising removing the first liner to expose a surface of the substrate in the second region.

13. The method of claim 12 further comprising recessing the exposed surface of the substrate in the second region.

14. The method of claim 13 further comprising forming a second source or drain region on the recessed surface of the substrate, the second source or drain region adjacent to the channel region of the second fin.

15. The method of claim 14 further comprising forming a second defect region on a surface of the second gate hard mask or the second spacer.

16. The method of claim 15 further comprising forming a second OPL on a surface of the second source or drain region.

17. The method of claim 16 further comprising removing the second defect region.

18. A semiconductor device comprising:
    a first fin in a first region of a substrate;
    a first gate over a channel region of the first fin, the first gate comprising a first spacer;
    a defect region adjacent to a surface of the first spacer; and
    a first liner between the defect region and the surface of the first spacer.

19. The semiconductor device of claim 18 further comprising:
    a second fin in a second region of the substrate;
    a second gate over a channel region of the second fin, the second gate comprising a second spacer;
    a second defect region adjacent to a surface of the second spacer; and
    a second liner between the second defect region and the surface of the second spacer.

20. The semiconductor device of claim 19, wherein the first region comprises a p-type field effect transistor (PFET) region and the second region comprises an n-type field effect transistor (NFET) region.

* * * * *